(12) United States Patent
Thakur

(10) Patent No.: US 6,204,142 B1
(45) Date of Patent: Mar. 20, 2001

(54) METHODS TO FORM ELECTRONIC DEVICES

(75) Inventor: Randhir P. S. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/138,950

(22) Filed: Aug. 24, 1998

(51) Int. Cl.$^7$ ............... H01L 21/20; H01L 21/31; H01L 21/469
(52) U.S. Cl. ............... 438/396; 438/791; 438/954
(58) Field of Search ............... 438/954, 396, 438/381, 761, 762, 791; 427/255.394

(56) References Cited

U.S. PATENT DOCUMENTS

| | | | |
|---|---|---|---|
| 4,907,046 | 3/1990 | Ohji et al. | 357/23.6 |
| 5,023,750 | 6/1991 | Hirayama | 361/313 |
| 5,371,039 | 12/1994 | Oguro | 437/101 |
| 5,432,626 | * 7/1995 | Sasuga et al. | 359/83 |
| 5,587,614 | 12/1996 | Hwang et al. | 257/532 |
| 5,624,865 | * 4/1997 | Schuegraf et al. | 438/396 |
| 5,629,043 | * 5/1997 | Inaba et al. | 427/79 |
| 5,663,087 | * 9/1997 | Yokozawa | 438/762 |
| 5,776,809 | 7/1998 | Schuegraf | 438/255 |
| 5,976,990 | * 11/1999 | Mercaldi et al. | 438/762 |

OTHER PUBLICATIONS

Thakur, R.P.S., et al., "Rapid Thermal Processing—Manufacturing Perspective", *Mat. Res. Soc. Symp. Proc.,* Materials Research Society, vol. 387 (1995).

DeBoer, S.J., et al., "Thin Nitride Films: Pushing The Limits Using Rapid Thermal Processing", *Mat. Res. Soc. Symp. Proc.,* Materials Research Society, vol. 429 (1996).

* cited by examiner

*Primary Examiner*—Richard Elms
*Assistant Examiner*—Adam Pyonin
(74) *Attorney, Agent, or Firm*—Wells, St. John, Roberts, Gregory & Matkin P.S.

(57) ABSTRACT

A first electrode and a doped oxide layer laterally proximate thereof are provided over a substrate. A silicon nitride layer is formed over both the doped oxide layer and the first electrode to a thickness of no greater than 80 Angstroms over at least the first electrode by low pressure chemical vapor deposition at a pressure of at least 1 Torr, a temperature of less than 700° C. and using feed gases comprising a silicon hydride and ammonia. The substrate with silicon nitride layer is exposed to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing. A second electrode is formed over the silicon dioxide layer and the first electrode. In another implementation, a layer comprising undoped oxide is formed over a doped oxide layer. A first electrode is formed proximate the undoped oxide layer and the undoped oxide layer. With the undoped oxide layer being outwardly exposed, a silicon nitride layer is formed on the undoped oxide layer and over the first electrode by low pressure chemical vapor deposition to a thickness of no greater than 80 Angstroms. Also disclosed are methods of forming transistor gate constructions and methods of forming electronic device constructions incorporating high K dielectric layer constructions.

9 Claims, 7 Drawing Sheets

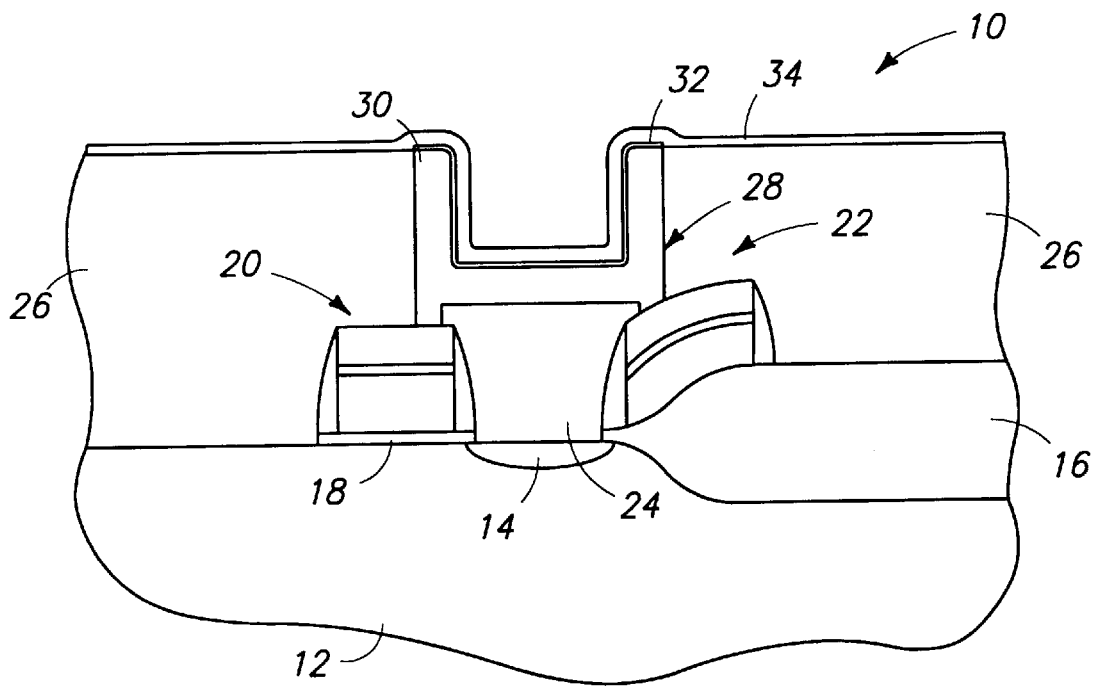
_FIG_ 3
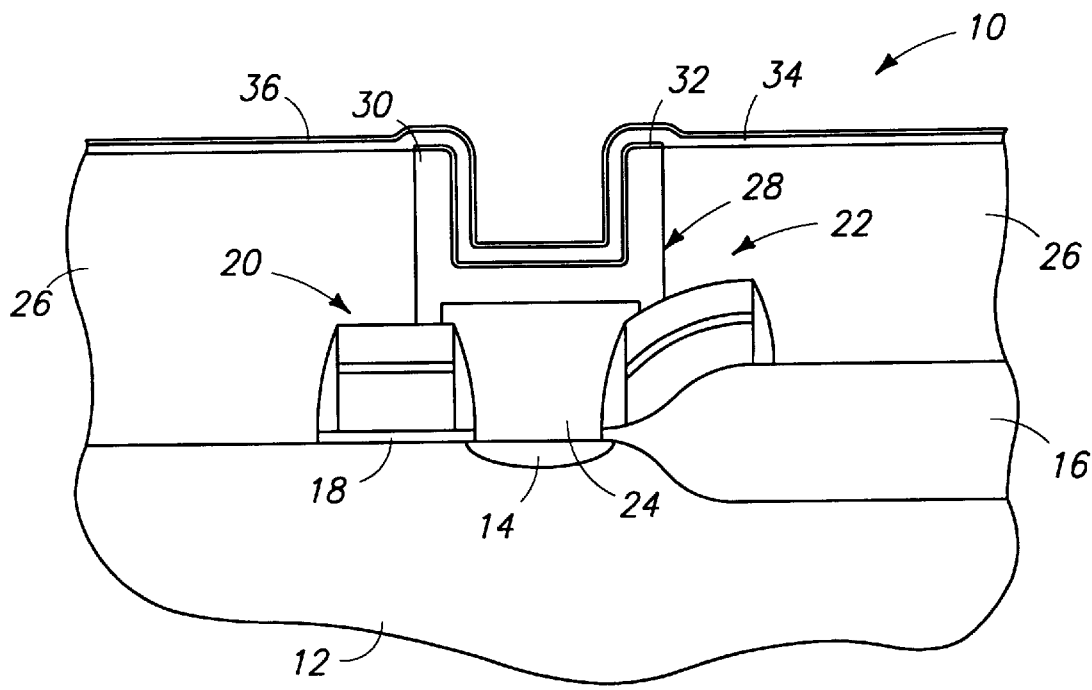
_FIG_ 4

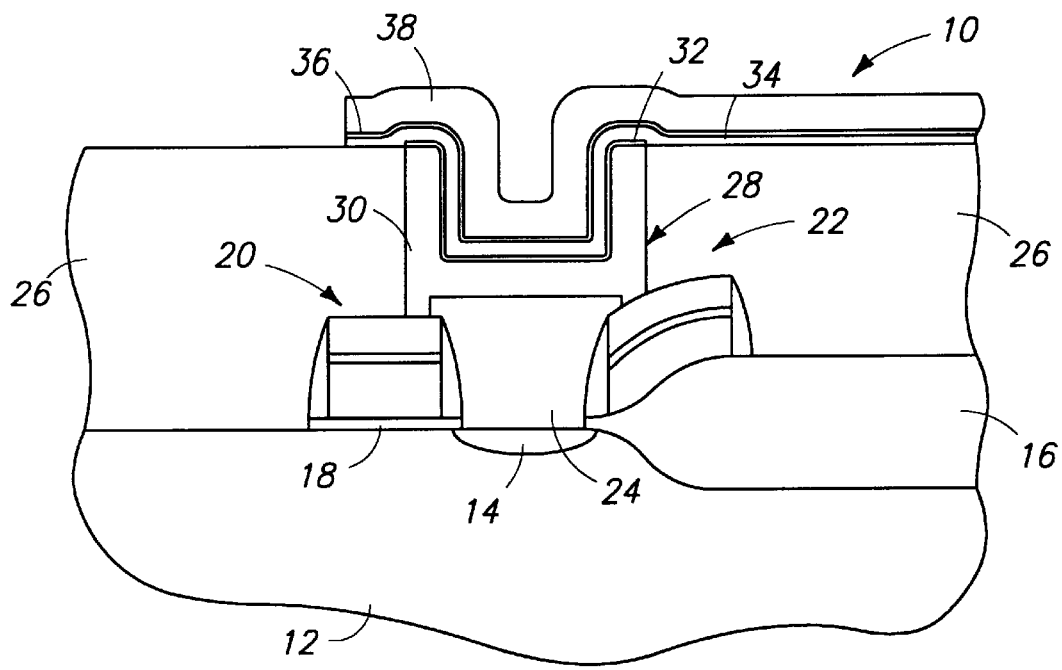
_Fig 5_
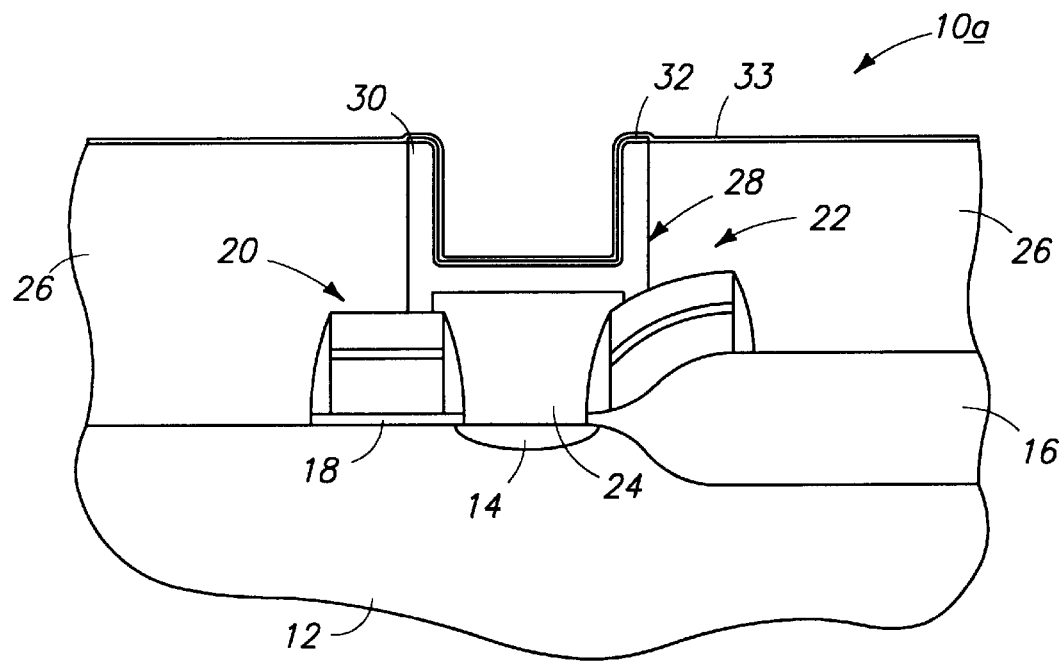
_Fig 6_

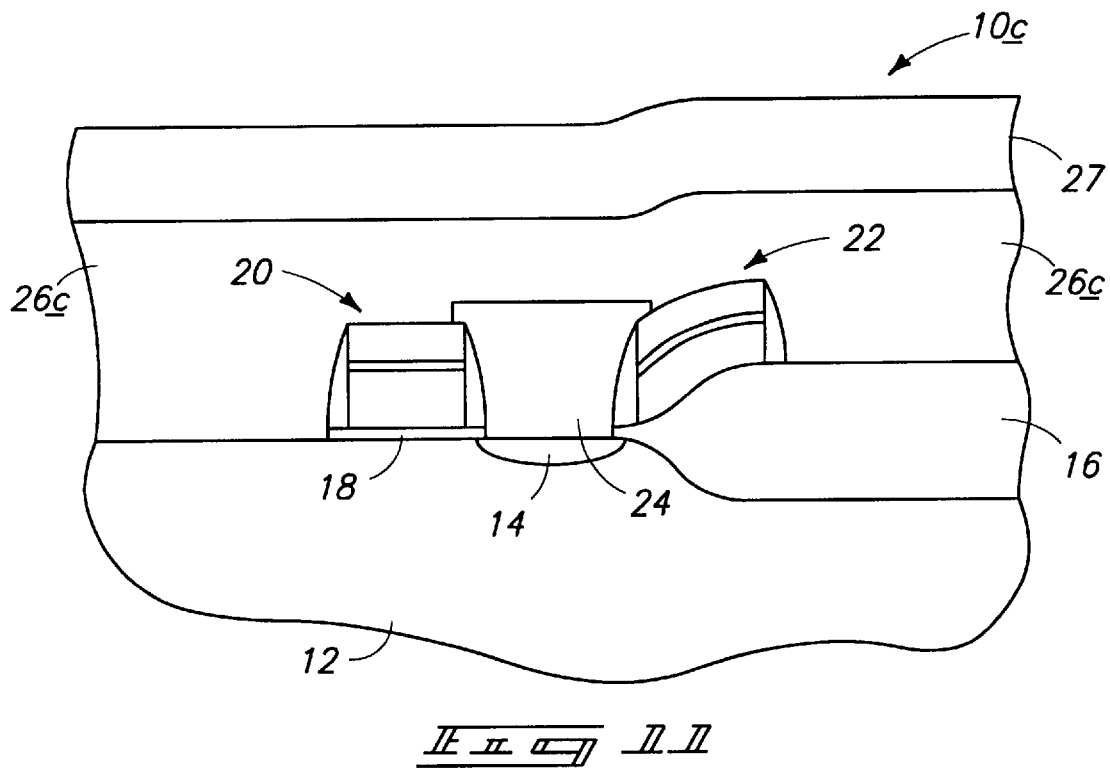
_Fig. 11_
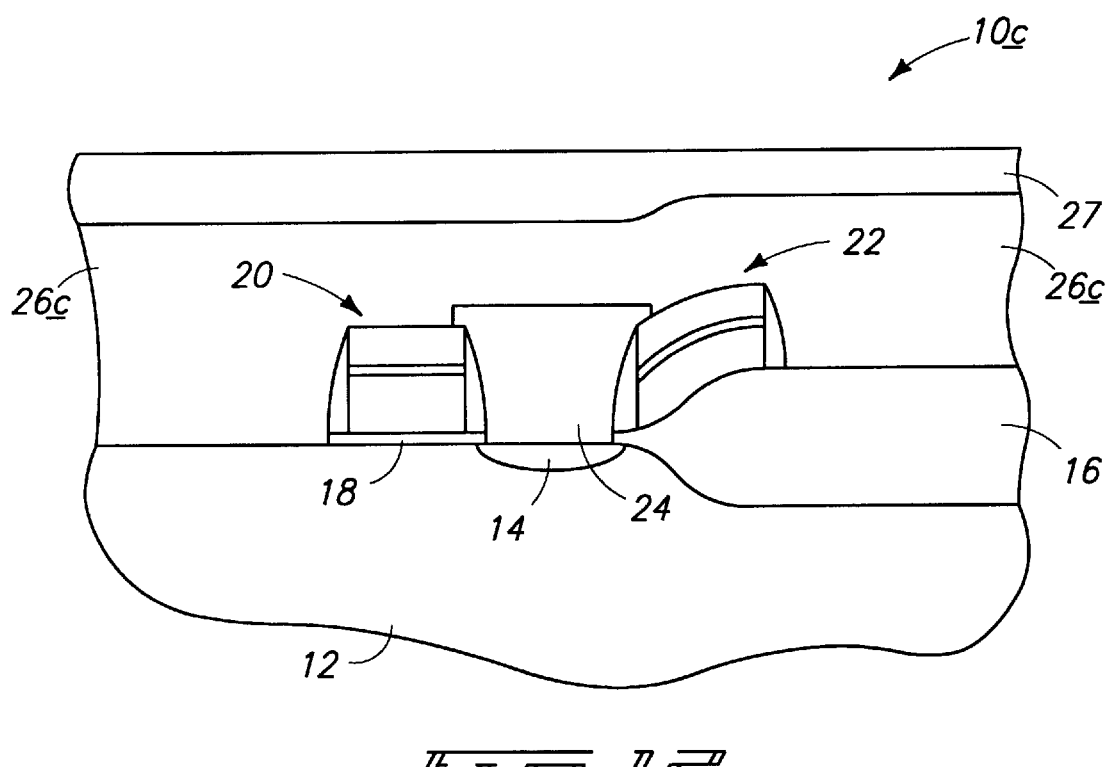
_Fig. 12_

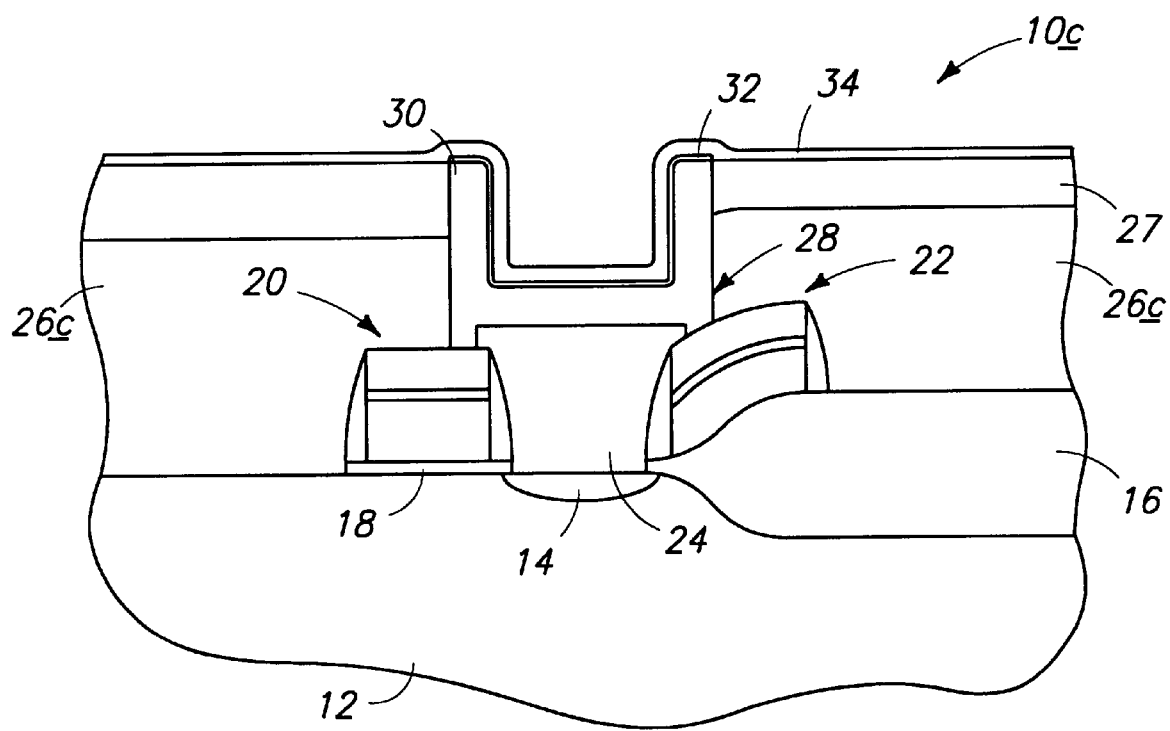
_FIG. 13_

METHODS TO FORM ELECTRONIC DEVICES

TECHNICAL FIELD

This invention relates to methods to form electronic devices, such as capacitors, antifuses, transistor gate stacks, and these and other devices incorporating high K dielectric layer constructions.

BACKGROUND OF THE INVENTION

As the density of DRAM cells increases, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature sizes continue to become smaller and smaller, development of improved materials for cell dielectrics as well as the cell design and structure become important. The feature size of higher density DRAMS, for example 256 Mb, will be on the order of 0.25 micron and less. Such overall reduction in cell size drives the thickness of the capacitor dielectric layer to smaller values, and conventional capacitor dielectric materials such as $SiO_2$ and $Si_3N_4$ might become unsuitable. However it would be desirable to utilize silicon oxides and nitrides in spite of the reduced thicknesses due to the ease of use and available thorough understanding of how to integrate these materials in DRAM process flows. Yet processing associated with chemical vapor deposition of thin silicon nitride films in certain environments has also created other problems not directly associated with the capacitors.

For example, one prior art technique is the fabrication of stacked capacitors in a container shape within a borophosphosilicate glass layer (BPSG) to form the storage capacitors in DRAM circuitry. Here, a container opening is formed in a planarized layer of BPSG over a desired node location, typically in the form of a conductive polysilicon plug. The conductive electrode material is deposited to less than completely fill the opening, and then is typically chemical-mechanically polished back to provide a storage node electrode inside of the BPSG opening in the shape of a cup or container. Capacitor dielectric material is then provided over the storage node container, followed by deposition of a conductive cell plate layer which is subsequently patterned.

As circuitry integration and density increases, the corresponding dimensions and thicknesses of the various components also decreases. A typical capacitor dielectric layer in the above construction comprises a silicon dioxide/silicon nitride/silicon dioxide composite (ONO). The first oxide layer formed over the storage node electrode is typically native oxide formed by exposure of the exposed storage node material to ambient air. Silicon nitride is next chemical vapor deposited, for example utilizing a silicon hydride such as dichlorosilane and ammonia. Typical deposition conditions are at sub-Torr pressures and temperatures at or above 680° C., more typically above 700° C. The deposition process and the very thin nature of the typically deposited silicon nitride layer results in pin holes or other defects in the deposited layer. This is typically cured by a dense re-oxidation process which forms the outer silicon dioxide layer of the ONO construction. The prior art re-oxidation conditions for forming this outer oxide layer are conducted wet or dry at a temperature of from 800° C. to 950° C. at atmospheric pressure for from 5 to 30 minutes. Subsequently, a conductive cell plate layer is deposited and patterned over the ONO dielectric layer(s).

However as the nitride thickness of the ONO construction over the storage node electrode fell to below 80 Angstroms, it was discovered that the underlying bulk silicon substrate was oxidizing to the point of circuit destruction. BPSG is known to be extremely diffusive to oxidizing components during the above-described re-oxidation conditions. Silicon nitride, on the other hand, is known to form a good barrier layer to diffusion of such oxidizing gases under such conditions. Yet, the silicon nitride deposited over the BPSG in conjunction with the capacitor dielectric layer formation was apparently inadequate in shielding oxidation of substrate material underlying the BPSG when the deposited silicon nitride layer thickness for the capacitors fell below 80 Angstroms.

The invention was principally motivated with respect to overcoming this problem to enable silicon nitride to continue to be utilized as a capacitor dielectric layer where its thickness fell to below 80 Angstroms in deposition also occurring over a doped oxide layer, such as BPSG.

SUMMARY OF THE INVENTION

The invention comprises methods of forming electronic devices, such as capacitors, antifuses, transistor gate constructions, and these and other devices incorporating high K dielectric layer constructions. In but one implementation, a first electrode and a doped oxide layer laterally proximate thereof are provided over a substrate. A silicon nitride layer is formed over both the doped oxide layer and the first electrode to a thickness of no greater than 80 Angstroms over at least the first electrode by low pressure chemical vapor deposition at a pressure of at least 1 Torr, a temperature of less than 700° C. and using feed gases comprising a silicon hydride and ammonia. The substrate with silicon nitride layer is exposed to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing. A second electrode is formed over the silicon dioxide layer and the first electrode.

In one implementation, the doped oxide layer and first electrode are exposed to rapid thermal nitridation conditions effective to grow a seed nitride layer over at least the doped oxide layer to a thickness of at least about 8 Angstroms prior to chemical vapor depositing a silicon nitride layer. In another implementation, the substrate is exposed to a nitrogen containing atmosphere which is substantially void of silicon hydride at a temperature of at least about 850° C. after chemical vapor depositing a silicon nitride layer.

In yet another implementation, a layer comprising undoped oxide is formed over a layer of doped oxide. A first electrode is formed proximate the undoped oxide layer and the doped oxide layer. With the undoped oxide layer being outwardly exposed, a silicon nitride layer is formed on the undoped oxide layer and over the first electrode by low pressure chemical vapor deposition to a thickness of no greater than 80 Angstroms.

Other aspects and implementations are described below.

BRIEF DESCRIPTION OF THE DRAWINGS

Preferred embodiments of the invention are described below with reference to the following accompanying drawings.

FIG. 3 is a view of the FIG. 1 wafer at a processing step subsequent to that depicted by FIG. 2.

FIG. 4 is a view of the FIG. 1 wafer at a processing step subsequent to that depicted by FIG. 3.

FIG. 5 is a view of the FIG. 1 wafer at a processing step subsequent to that depicted by FIG. 4.

FIG. 6 is a view an alternate embodiment semiconductor wafer fragment in accordance with the invention.

FIG. 11 is a view an alternate embodiment semiconductor wafer fragment in accordance with the invention.

FIG. 12 is a view of the FIG. 11 wafer at a processing step subsequent to that depicted by FIG. 11.

FIG. 13 is a view of the FIG. 11 wafer at a processing step subsequent to that depicted by FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been recognized that the chemical vapor deposition of silicon nitride utilizing silicon hydride gases and ammonia occurs at different rates over the storage node electrode of a DRAM capacitor (including any thin oxide formed thereover) and doped oxides. Specifically, such deposition of silicon nitride is largely selective to the storage node (typically polysilicon), and regardless is at a considerably greater growth rate than what occurs over the BPSG or other doped oxide layers. Accordingly, as the silicon nitride layer thickness over the storage node fell to below 80 Angstroms, an apparent lesser quantity growing over the doped oxide layer resulted in a layer too thin to achieve the barrier layer effect during the subsequent re-oxidation to form the outer oxide layer of the capacitor dielectric ONO composite. Several processing solutions in accordance with the invention have been developed.

Figure 1:
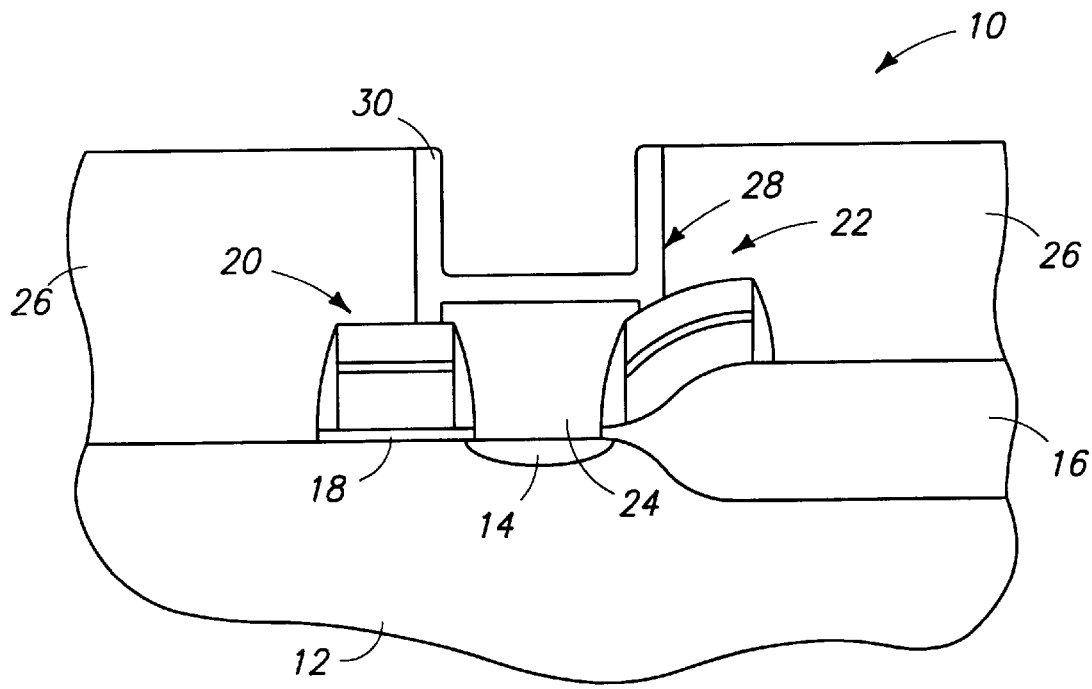
FIG. 1 is a diagrammatic view of a semiconductor wafer fragment at one processing step in accordance with the invention.

Referring to FIG. 1, a semiconductor wafer fragment or substrate is indicated generally with reference numeral 10. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Fragment 10 comprises a bulk monocrystalline silicon substrate 12 having a diffusion region 14 formed therein. Field oxide region 16 and a gate oxide layer 18 are formed over bulk substrate 12. A pair of word lines 20 and 22 are formed on opposing sides of diffusion region 14. A conductive polysilicon plug 24 is provided over and in electrical connection with diffusion region 14. A layer 26 of doped oxide, preferably BPSG, is provided over the illustrated component, and formed to have a container storage node opening 28 provided therein over plug 24. A conductively doped, and preferably hemispherical grain, polysilicon layer has been formed over the substrate to within container opening 28. Such has been planarized back to form the illustrated isolated first capacitor electrode 30, with doped oxide layer 26 being positioned laterally proximate thereof.

Figure 2:
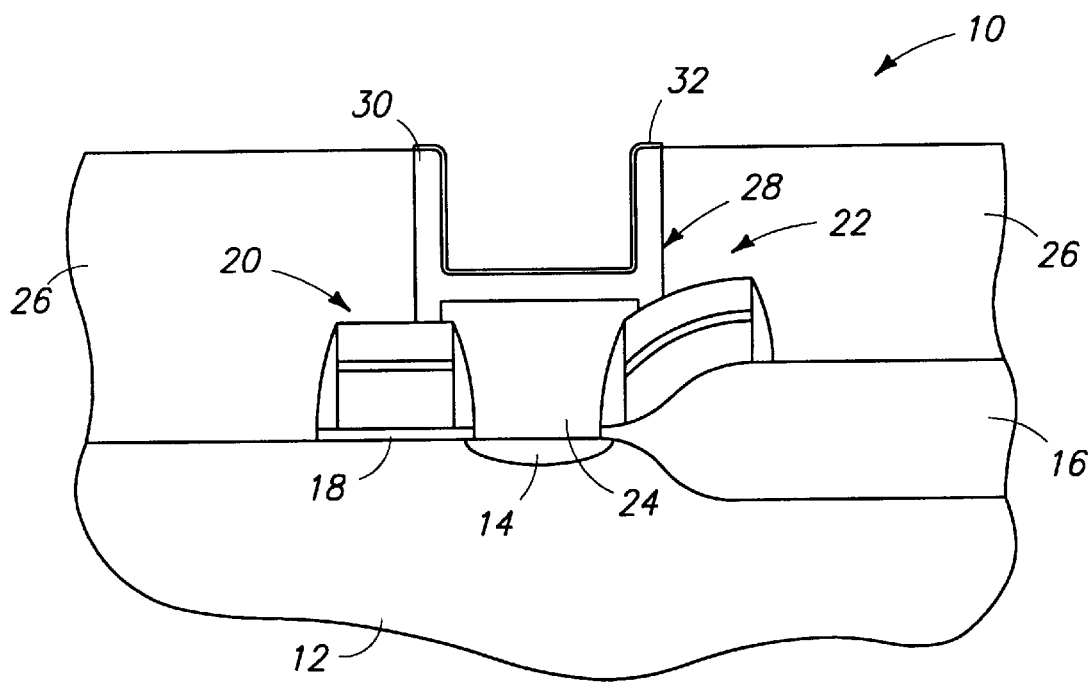
FIG. 2 is a view of the FIG. 1 wafer at a processing step subsequent to that depicted by FIG. 1.

Referring to FIG. 2, a silicon dioxide layer 32 can be formed on first capacitor electrode 30, such as by exposing the substrate to ambient air to form a native oxide layer or by CVD or other deposition. Regardless, an exemplary thickness for layer 32 is Angstroms and less. A silicon nitride layer will subsequently be formed, as described below. Alternately, and perhaps more preferred, would be to prevent any formation of an oxide layer 32 over the first capacitor electrode, such as by precluding the wafer from being exposed to oxidizing conditions intermediate the processing which produces the FIG. 1 construction and placement of the wafer within the deposition chamber for the silicon nitride layer deposition. Such can be accomplished by using conventional cluster equipment which precludes exposure of the wafer to oxidizing conditions when passing between different processing chambers.

Referring to FIG. 3, a silicon nitride layer 34 is formed over both doped oxide layer 26 and first capacitor electrode 30 to a thickness of no greater than 80 Angstroms over at least first capacitor electrode 30 by low pressure chemical vapor deposition (with or without plasma) at a pressure of at least 1 Torr, a temperature of less than 700° C., and using feed gases comprising a silicon hydride and ammonia. In the context of this document, "low pressure chemical vapor deposition" is intended to define any chemical vapor deposition process occurring at or below 760 Torr. Prior art processing which achieved less than adequate silicon nitride layer deposition over the doped oxide layer utilized pressures below 1 Torr and temperatures of 680° C. or greater. It has been discovered that increasing the deposition pressure to at least 1 Torr at deposition temperatures of less than 700° C. results in less selectivity of the deposition between exposed polysilicon or thin oxide formed thereover and doped oxide of layer 26. Accordingly, a suitably thick layer can be deposited to effectively preclude oxidation of oxidizable material beneath layer 26 during a subsequent oxidation of the silicon nitride layer. Layer 34 will also typically deposit to a thickness of less than 80 Angstroms over doped oxide layer 26, and still perhaps to a thickness lower than the thickness of the silicon nitride layer deposited over first capacitor electrode 30. A more preferred pressure range during the silicon nitride deposition is between 1.0 Torr and 2.5 Torr, with a preferred temperature during formation being less than or equal to 680° C. Further, silicon nitride layer formation over first capacitor electrode 30 can be to a thickness of no greater than 60 Angstroms in accordance with a desired capacitor construction.

As shown, first capacitor electrode 30 is not outwardly exposed during the formation of silicon nitride layer 34 thereover, rather being covered by oxide layer 32. Alternately and perhaps more preferred, first capacitor electrode 30 is void of layer 32 and is outwardly exposed during the formation of the silicon nitride layer 34 thereover, with the silicon nitride layer being formed on doped first capacitor electrode material 30. Also as shown and preferred, the silicon nitride layer forms on the doped oxide layer as opposed to on any intervening layer. Example and preferred deposition conditions utilize dichlorosilane and ammonia at a temperature of 640° C., and a pressure of 1.5 Torr. Ammonia flow rate to dichlorosilane flow rate is preferably at 3:1 or greater, by volume.

Referring to FIG. 4, the substrate is exposed to oxidizing conditions comprising at least 700° C. to form a silicon dioxide comprising layer 36 over silicon nitride layer 34. The thickness of silicon nitride layer 34 over doped oxide layer 26 is sufficient to shield oxidizable substrate material beneath doped oxide layer 26 (i.e., bulk substrate material 12) from oxidizing during the re-oxidation exposure. An example and preferred thickness for layer 36 is from 10 to 30 Angstroms. Example wet oxidation conditions (i.e., in the presence of steam) or dry oxidation conditions (i.e., in the presence of oxygen) include exposure at from 800° C.–950° C. in an atmospheric furnace for from 5 to 30 minutes.

Referring to FIG. 5, a second capacitor electrode layer 38 (i.e., conductively doped polysilicon) is deposited and patterned to form a second capacitor electrode over silicon dioxide layer 36 and first capacitor electrode 30. Such provides but one example method in accordance with the invention for producing an adequately thick layer of silicon nitride over BPSG layer 26 in spite of thickness of such layer at least over storage node layer 30 being less than 80 Angstroms thick.

In one alternate embodiment, silicon nitride layer 34 can comprise a combination of a first or primary and a subsequent secondary layer, or more layers. For example, an initial layer of silicon nitride could be chemical vapor deposited at a pressure of least 1 Torr and a temperature of less than 700° C. This could be followed by a subsequent secondary silicon nitride layer deposition on the first layer by low pressure chemical vapor deposition at a pressure of less than 1 Torr and a temperature of least 700° C. using feed gases comprising a silicon hydride and ammonia. The secondary layer of silicon nitride would be formed to provide a combined thickness of the silicon nitride layers of no greater than 80 Angstroms over first capacitor electrode 30.

In an alternate considered implementation, a first silicon nitride layer is formed over both the doped oxide layer and the first capacitor electrode to a thickness of no greater than 70 Angstroms over at least the first capacitor electrode by low pressure chemical vapor deposition using a first set a reactor conditions using feed gases comprising of silicon hydride and ammonia. After using the first set of conditions and depositing the first layer, a second silicon nitride layer is formed on the first to a thickness of no greater than 70 Angstroms over at least the first capacitor electrode by lower pressure chemical vapor deposition using a second set of reactor conditions using feed gases comprising a silicon hydride and ammonia. The second layer is formed to provide a combined thickness of the first and second nitride layers of no greater than 80 Angstroms over the first capacitor electrode.

A further alternate embodiment is described with reference to FIGS. 6–8. Like numerals from the first described embodiment are utilized where appropriate, with differences being indicated with the suffix "a" or with different numerals. FIG. 6 illustrates processing occurring immediately after FIG. 2 of the first described embodiment. First oxide layer 32 is shown formed over first capacitor electrode 30, although such could be and might preferably not be provided. Regardless, the substrate is exposed to rapid thermal nitridation conditions effective to grow a silicon nitride seed layer 33 over at least doped oxide layer 26 to a thickness of at least about 8 Angstroms. As shown and as preferred, layer 33 also forms over and on layer 32. If oxide layer 32 is not present and first capacitor electrode 30 is outwardly exposed during the exposing, layer 33 will also typically and preferably form over and on first capacitor electrode 30. Seed layer 33 is ideally grown to a thickness of no greater than 20 Angstroms. Example and preferred conditions utilize $NH_3$ at from 500 Torr to 1 atmosphere, with a ramp rate of between about 50° C./sec to 150° C./sec to a temperature of between about 800° C. and 1025° C. The substrate is preferably then held at the upper temperature for a time period ranging from about 5 seconds to 60 seconds.

Figure 7:
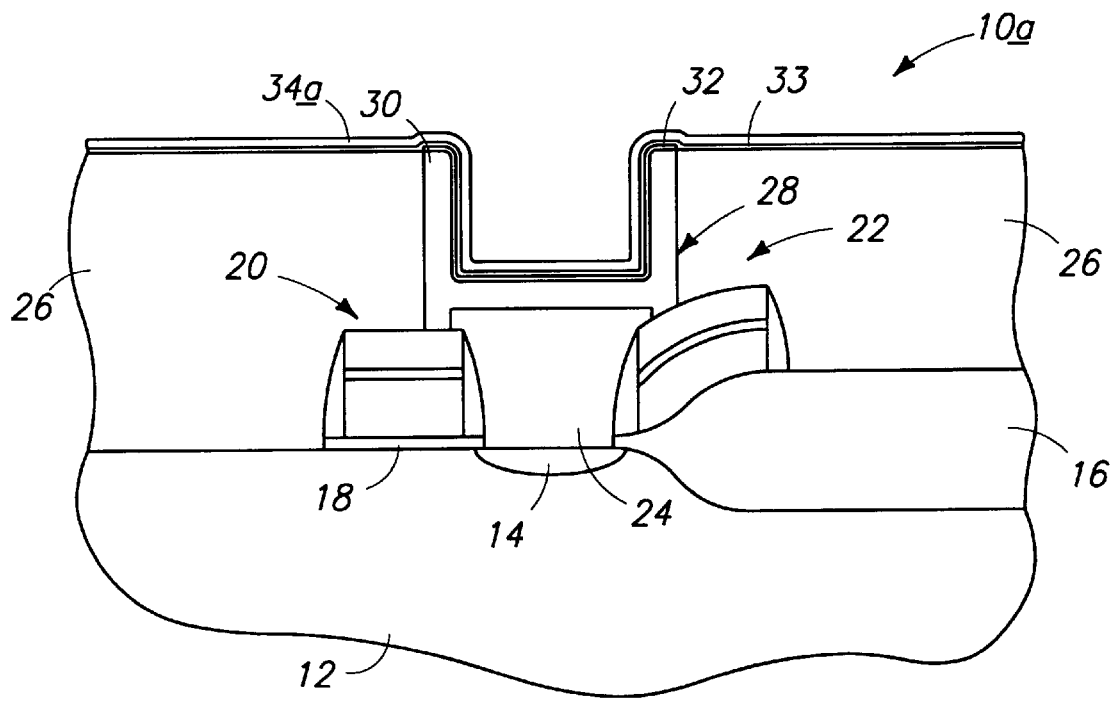
FIG. 7 is a view of the FIG. 6 wafer at a processing step subsequent to that depicted by FIG. 6.

Referring to FIG. 7, silicon nitride layer 34a is formed over both seed nitride layer 33 and first capacitor electrode 30 by lower pressure chemical vapor deposition using feed gases comprising silicon hydride and ammonia. Pressure can be greater than 1 Torr in accordance with the above first-described preferred embodiment, or less than 1 Torr in accordance with the prior art process which precipitated the undesired selectivity to not deposit on an exposed doped oxide layer. A combined thickness of silicon nitride layer 36a and any seed nitride layer 33 forming over first capacitor electrode 30 is no greater than 80 Angstroms, and preferably no greater than 60 Angstroms.

Figure 8:
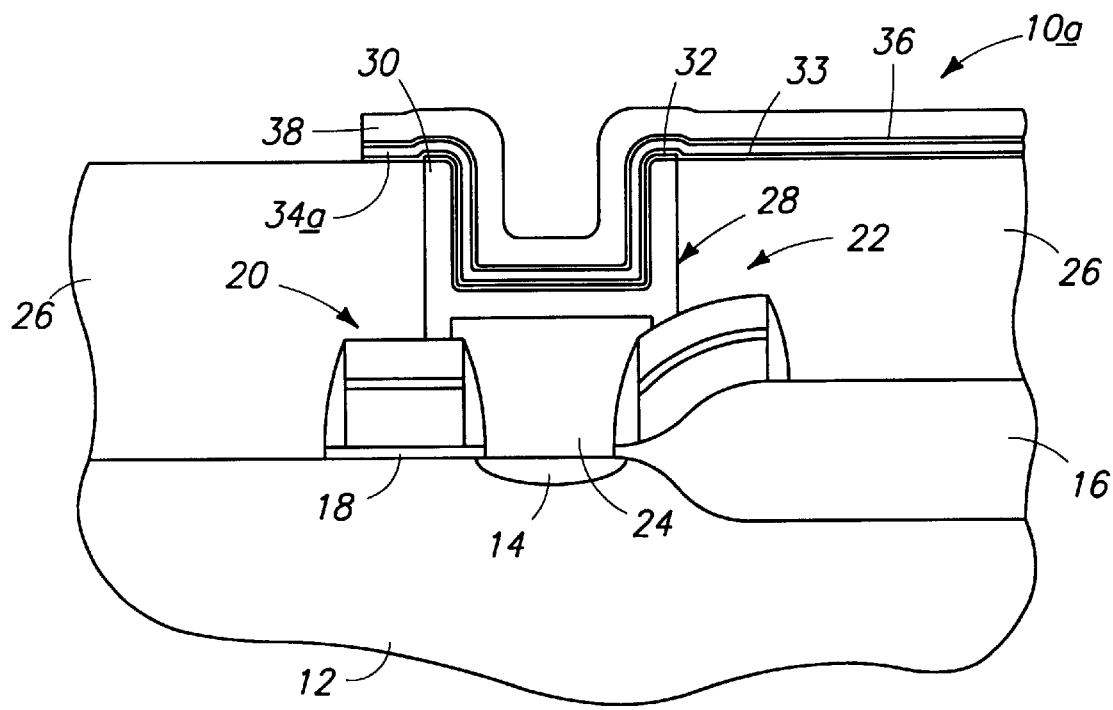
FIG. 8 is a view of the FIG. 6 wafer at a processing step 8 subsequent to that depicted by FIG. 7.

Referring to FIG. 8, the substrate is exposed to oxidizing conditions comprising at least 700° C. to form a silicon dioxide layer 36 on silicon nitride layer 34a, with the thickness of layers 33 and 34a during such exposing conditions and exposing time being effective to prevent oxidizable substrate material beneath doped oxide layer 26 from oxidizing during such exposing. Subsequently, a second capacitor electrode layer 38 is formed over silicon dioxide layer 36 and first capacitor electrode 30.

Figure 9:
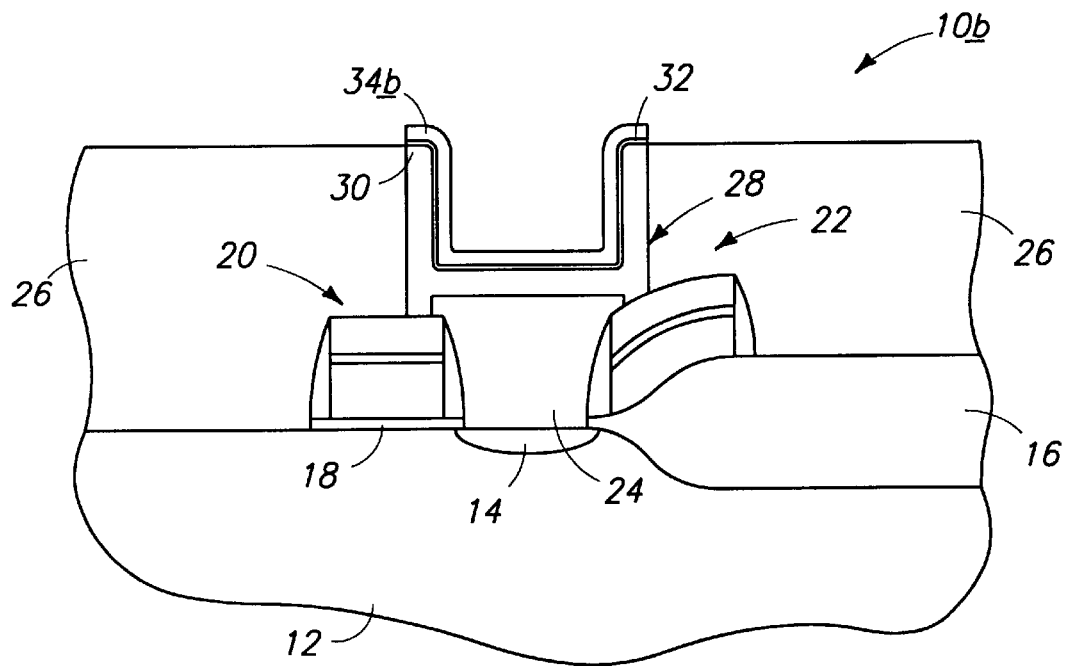
FIG. 9 is a view another alternate embodiment semiconductor wafer fragment in accordance with the invention.

Yet another alternate embodiment is described with reference to FIGS. 9 and 10. Like numerals from the first-described embodiment are utilized where appropriate, with differences being indicated by the suffix "b" or with different numerals. Processing of wafer fragment 10b as illustrated in FIG. 9 occurs subsequent to the processing as shown in FIG. 2. Specifically, a silicon nitride layer 34b is formed at least over first capacitor electrode 30 to a thickness of no greater than 80 Angstroms by low pressure chemical vapor deposition using feed gases comprising a silicon hydride and ammonia. Processing could occur as described above with respect to the first-described preferred embodiment with low pressure conditions above 1 Torr. Alternately and as shown, silicon nitride layer 34b can be deposited at pressures below 1 Torr, potentially resulting in little or no silicon nitride layer formation over doped oxide layer 26.

Figure 10:
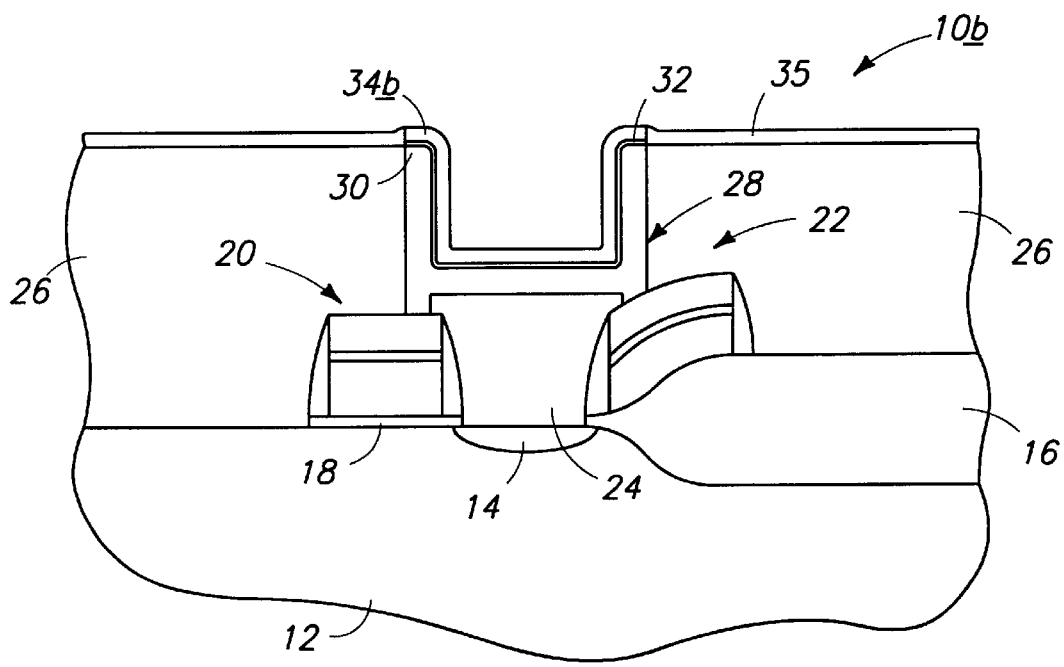
FIG. 10 is a view of the FIG. 9 wafer at a processing step subsequent to that depicted by FIG. 9.

Referring to FIG. 10, and after forming a silicon nitride layer 34b, the substrate is exposed to a nitrogen containing atmosphere which is substantially void of silicon hydride at a temperature of at least about 850° C. The intent is to cause a reaction of the nitrogen containing atmosphere with silicon of oxide layer 26 effective to form a suitably thick silicon nitride layer 35 over doped oxide layer 26 effective to preclude substrate oxidation during the subsequent re-oxidation conditions. Further in the context of this embodiment, doped oxide layer 26 can have been previously exposed to rapid thermal nitridation conditions as described above effective to grow seed nitride layer over at least doped oxide layer 26 to a thickness of at least about 8 Angstroms. Example and preferred nitrogen containing atmospheres include $NH_3$ and oxynitride compounds, such as $NO_x$. Preferred anneal conditions in such atmosphere(s) include a temperature at from 850° C. to 950° C. at from 10 Torr to 2 atmospheres at 10 seconds to 60 seconds. Processing could subsequently proceed as described above.

Yet another alternate embodiment is described with reference to FIGS. 11–13. Like numerals from the first-described embodiment have been utilized where appropriate, with differences being indicated by the suffix "c" or with different numerals. Wafer fragment 10c is shown at a processing step prior in time to any of the processing depicted by the alternate processes of the above-described embodiments. A doped oxide layer 26c, such as BPSG, is formed over the substrate followed by a formation of undoped oxide layer 27 thereover. Undoped oxide layer 27 can be formed by separate dedicated processing in a separate chamber relative to the formation of 26c. Alternately and more preferred, undoped oxide layer 27 is formed in situ with chemical vapor deposition of BPSG layer 26c by substantially ceasing flow of boron and phosphorus doping gases at the conclusion of layer 26c deposition. Example thicknesses for layer 26c and 27 are from 10,000 to 20,000 Angstroms and 5,000 Angstroms, respectively. In the context of this document, "undoped" is defined as any dopant concentration below 1% by volume. BPSG is typically doped to around 4% by volume combined phosphorus and boron concentration.

Referring to FIG. 12, a portion of undoped oxide layer 27 is removed, such as by chemical-mechanical polishing, to reduce at least 50% of its initial thickness over doped oxide layer 26c. An example removal is between 3,000 and 4,000 Angstroms of the example 5,000 Angstroms initially deposited. Such provides the illustrated planar upper surface leaving an outermost layer of undoped oxide 27 over doped oxide layer 26c. Processing can then proceed in accordance with the prior art, or in combination with any one or more of the above-described preferred embodiments. Even in accordance with the prior art processing, an undoped oxide layer is now provided to be outwardly exposed when the preferred silicon nitride layer of less than 80 Angstroms is being chemical vapor deposited for the capacitor dielectric layer. Thus, silicon nitride layer deposition, even under the prior art conditions, will more uniformly deposit to provide a suitably thick nitride barrier layer over doped oxide layer 26c to substantially preclude oxidation of substrate oxidizable material beneath layer 26c during the pin hole defect curing nitride re-oxidation. The resultant construction is shown in FIG. 13.

The invention was principally motivated from problems associated with capacitor fabrication where silicon nitride layer thickness in an ONO construction fell below 80 Angstroms, with the substrate also comprising outwardly exposed boron and/or phosphorus doped silicate glass. Aspects of the invention are also believed applicable in fabrication of other electronic devices and materials, with the invention only being limited by the accompanying claims appropriately interpreted in accordance with the Doctrine of Equivalents. By way of example only, example alternate constructions include antifuses and transistor gates. For example, the invention contemplates fabrication of silicon nitride layers, such as described above, to comprise at least a portion of a dielectric layer separating two antifuse electrodes. Further, methods in accordance with the invention could also be utilized to fabricate gate dielectric layers, such as layer 18 of the FIGS. 1–13 above-described embodiments. Further, the invention contemplates processing of dielectric layers in the context of floating gate fabrication, with the subject dielectric layer forming either the typical top and/or bottom dielectric layer(s) utilized in floating gate constructions.

Further, the invention contemplates methods of forming electronic devices incorporating a high K dielectric layer construction. In the context of this document, "high K" is intended to define a dielectric layer having a dielectric constant K of at least 15. By way of example only, such materials include (Ba, Sr)TiO$_3$, SrTiO$_3$, (Pb, Zr) TiO$_3$, Ta$_2$O$_5$, and Nb$_2$O$_5$. Nitride layers formed in accordance with the invention, such as described above, can form useful passivation and other purpose layers when formed on high K dielectric layers utilized in electronic devices incorporating high K dielectric layers and another conductive component, such as for example capacitors in antifuse constructions.

In compliance with the statute, the invention has been described in language more or less specific as to structural and methodical features. It is to be understood, however, that the invention is not limited to the specific features shown and described, since the means herein disclosed comprise preferred forms of putting the invention into so effect. The invention is, therefore, claimed in any of its forms or modifications within the proper scope of the appended claims appropriately interpreted in accordance with the doctrine of equivalents.

What is claimed is:

1. A method of forming an electronic device comprising:

providing a first electrode and a doped oxide layer laterally proximate thereof over a substrate;

forming a silicon nitride layer over both the doped oxide layer and the first electrode to a thickness of no greater than 80 Angstroms over at least the first electrode by low pressure chemical vapor deposition at a pressure of at least 1 Torr but not greater than 2.5 Torr, a temperature of less than or equal to 650° C. and using feed gases comprising a silicon hydride and ammonia;

exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and forming a second electrode over the silicon dioxide layer and the first electrode.

2. The method of claim 1 wherein the silicon nitride layer is formed to a thickness of less than 80 Angstroms over the doped oxide layer.

3. The method of claim 1 wherein the silicon nitride layer is formed on the doped oxide layer.

4. The method of claim 1 wherein the first electrode is outwardly exposed during the forming of the silicon nitride layer thereover.

5. The method of claim 1 wherein the first electrode is not outwardly exposed during the forming of the silicon nitride layer thereover.

6. The method of claim 1 wherein the first electrode is covered with an oxide layer during the forming of the silicon nitride layer thereover.

7. The method of claim 1 wherein the doped oxide layer comprises BPSG.

8. The method of claim 1 wherein the silicon nitride is formed by plasma deposition.

9. The method of claim 1 wherein the silicon nitride is formed to a thickness no greater than 60 Angstroms.

* * * * *

UNITED STATES PATENT AND TRADEMARK OFFICE
CERTIFICATE OF CORRECTION

| | |
|---|---|
| PATENT NO. : 6,204,142 B1 | Page 1 of 1 |
| DATED : March 20, 2001 | |
| INVENTOR(S) : Randhir P.S. Thakur | |

It is certified that error appears in the above-identified patent and that said Letters Patent is hereby corrected as shown below:

Column 3,
Line 19, delete "8".

Column 4,
Line 18, replace "is Angstroms" with -- is 20 Angstroms --.

Column 8,
Line 20, replace "so effect" with -- effect --.

Signed and Sealed this

Eleventh Day of December, 2001

*Attest:*

NICHOLAS P. GODICI
*Attesting Officer*   *Acting Director of the United States Patent and Trademark Office*